United States Patent
Lee

(10) Patent No.: US 7,773,434 B2
(45) Date of Patent: Aug. 10, 2010

(54) DELAY CIRCUIT AND SEMICONDUCTOR MEMORY DEVICE HAVING THE SAME

(75) Inventor: Sang-Hee Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 241 days.

(21) Appl. No.: 12/157,243

(22) Filed: Jun. 9, 2008

(65) Prior Publication Data
US 2009/0168555 A1    Jul. 2, 2009

(30) Foreign Application Priority Data
Dec. 27, 2007    (KR) .................. 10-2007-0138919

(51) Int. Cl.
*G11C 7/00*    (2006.01)
(52) U.S. Cl. .............. 365/194; 365/189.09; 365/189.11
(58) Field of Classification Search ................ 365/194, 365/189.09, 189.11
See application file for complete search history.

(56) References Cited
U.S. PATENT DOCUMENTS
7,663,945 B2 *    2/2010    Takahashi et al. ........... 365/194

FOREIGN PATENT DOCUMENTS
| JP | 2001-156261 A | 6/2001 |
| JP | 2002-050945 A | 2/2002 |
| KR | 10-2004-0008495 | 1/2004 |
| KR | 10-2007-0010920 A | 1/2007 |

* cited by examiner

*Primary Examiner*—Son Dinh
*Assistant Examiner*—Nam Nguyen
(74) *Attorney, Agent, or Firm*—Blakely, Sokoloff, Taylor & Zafman

(57) ABSTRACT

A delay circuit is capable of securing a constant delay time in spite of a process variation as well as voltage and temperature variations. Using the delay circuit that secures a sensing margin time in spite of process, voltage and temperature variations, a semiconductor memory device is capable of amplifying desired data within a preset RAS to CAS delay (tRCD). The delay circuit includes a delay unit including a current source controlled by a bias voltage, a delay time of the delay unit being changed depending on current amount of the current source, and a bias voltage generating unit configured to divide a power supply voltage using a first resistor to generate the bias voltage, wherein the delay unit includes a second resistor inserted into a current path of the current source.

31 Claims, 5 Drawing Sheets

US 7,773,434 B2

DELAY CIRCUIT AND SEMICONDUCTOR MEMORY DEVICE HAVING THE SAME

CROSS-REFERENCE TO RELATED APPLICATIONS

The present invention claims priority of Korean patent application number 10-2007-0138919, filed on Dec. 27, 2007, which is incorporated by reference in its entirety.

BACKGROUND OF THE INVENTION

The present invention relates to a semiconductor memory device, and more particularly to a delay circuit having a delay time corresponding to an environmental change, and a circuit of generating a bit line sense amplifier enable signal using the same.

In general, a semiconductor memory device such as a double data rate synchronous DRAM (DDR SDRAM) includes a plurality of memory cells that are enabled/disabled according to a plurality of addresses, and writes data to a corresponding memory cell or reads the data from the memory cell using these addresses.

Herebelow, a read operation for outputting stored data will be described.

When a word line selected by a row address is enabled, a plurality of memory cells connected to the word line operate so that a charge sharing occurs between the memory cells and bit lines connected thereto. At this time, there is a slight voltage difference between a bit line where the charge sharing occurs and a bit line bar where the charge sharing does not occur, and such a voltage difference is then sensed and amplified by a bit line sense amplifier.

FIG. 1 is a circuit diagram illustrating a partial configuration of a conventional semiconductor memory device.

Referring to FIG. 1, the conventional semiconductor memory-device includes a memory cell 110 configured to store data, an upper bit line separator 120A, a lower bit line separator 120B, a bit line equalizer 130, a bit line sense amplifier 140, a power supply 150 and a column selector 160.

Recently, a semiconductor memory device has adopted a sharing method where an upper memory cell, i.e., the memory cell 110, and a lower memory cell (not shown) share one bit line sense amplifier 140. Therefore, the upper bit line separator 120A separates/connects the upper memory cell 110 from/to the bit line sense amplifier 140 in response to an upper separation signal BISH, and the lower bit line separator 120B separates/connects the lower memory cell from/to the bit line sense amplifier 140 in response to a lower separation signal BISL.

The bit line equalizer 130 is used to equalize or precharge a bit line BL and a bit line bar /BL to a precharge voltage VBLP in response to an equalization signal BLEQ. Here, a level of the precharge voltage VBLP is half the level of a core voltage (VCORE).

The bit line sense amplifier 140 senses a slight voltage difference between the bit line BL and the bit line bar /BL to amplify one of the bit lines BL and /BL to a voltage level of a pull-up power line RTO and amplify the other one of the bit lines BL and /BL to a voltage level of a pull-down power line SB.

The column selector 160 transfers data amplified by the bit line sense amplifier 140 to a segment line pair SIO and /SIO in response to a column select signal YI that is activated in a read operation. For reference, the data transferred to the segment line pair SIO and /SIO are inputted to an input/output (I/O) sense amplifier (not shown) through a local I/O line pair (not shown) and then re-amplified. The re-amplified data are transferred to a data I/O pad (not shown) through a global I/O line pair (not shown) and then outputted to the outside.

The power supply 150 supplies a power to the bit line sense amplifier 140 through the pull-up power line RTO and the power-down power line SB. The power supply 150 includes a power line equalization unit 152, a pull-up power supply unit 154A, a pull-down power supply unit 154B and an overdriving power supply unit 156.

The power line equalization unit 152 equalizes or precharges the pull-up and pull-down power lines RTO and SB to the precharge voltage VBLP in response to the equalization signal BLEQ. The pull-up power supply unit 154A supplies a core voltage VCORE to the pull-up power line RTO in response to a pull-up driving control signal SAP. The pull-down power supply unit 154B supplies a ground voltage VSS to the pull-down power line SB in response to a pull-down driving control signal SAN. The overdriving voltage supply unit 156 is used to short a VCORE terminal and an external voltage (VDD) terminal in response to an overdriving control signal OVDP.

FIG. 2 is a simulation graph illustrating an active operation and a precharge operation of the upper memory cell 110 in FIG. 1.

Referring to FIGS. 1 and 2, before a word line WL is enabled, the bit line pair BL and /BL is equalized or precharged to the precharge voltage VBLP due to the equalization signal BLEQ of logic high level, and the pull-up and pull-down power lines RTO and SB are also equalized or precharged to the precharge voltage VBLP.

After such a precharge operation, when the word line WL is enabled to trigger charge sharing between the upper memory cell 110 and the bit line BL, a slight voltage difference begins to occur between the bit line BL and the bit line bar /BL. Here, it is assumed that data of logic low level is stored in the upper memory cell 110 for convenience in description. From the assumption, a voltage level of the bit line BL is slightly lowered due to the data of logic low level stored in the upper memory cell 110.

Subsequently, the pull-up driving control signal SAP, the pull-down driving control signal SAN and the overdriving control signal OVDP are activated after a predetermined time (hereinafter, referred to as 'sensing margin time') that is sufficient for allowing the bit line sense amplifier 140 to sense the slight voltage difference between the bit line BL and the bit line bar /BL. The pull-up power line RTO is driven to the core voltage VCORE and the pull-down power line SB is driven to the ground voltage VSS. Accordingly, the bit line sense amplifier 140 performs an amplification operation such that a voltage level of the bit line bar /BL is rapidly increased and a voltage level of the bit line BL is rapidly decreased.

To rapidly amplify the bit line pair BL and /BL, an overdriving scheme has been recently adopted in the semiconductor memory device. In the overdriving scheme, the VCORE terminal and the VDD terminal are shorted during an initial period of amplifying the bit line pair BL and /BL, thus allowing the voltage level of the corresponding bit line to be rapidly increased.

FIG. 3 is a block diagram illustrating a circuit block configured to generate the pull-up driving control signal SAP and the pull-down driving control signal SAN.

Referring to FIG. 3, the circuit block includes a bit line sense amplifier (BLSA) enable signal generator 310 and a driving control signal generator 330. The BLSA enable signal generator 310 generates an enable signal SA_EN for operating the bit line sense amplifier 140 in response to an active pulse signal ACT_PUL and a precharge pulse signal PCG_PUL. The driving control signal generator 330 generates the pull-up driving control signal SAP and the pull-down driving control signal SAN in response to the enable signal SA_EN.

Here, when the active pulse signal ACT_PUL relative to an active operation is activated, the enable signal SA_EN is activated after the sensing margin time. The driving control signal generator 330 generates the activated pull-up and pull-down driving control signals SAP and SAN in response to the activated enable signal SA_EN.

Thereafter, when the precharge pulse signal PCG_PUL relative to the precharge operation is activated, the enable signal SA_EN is deactivated. The driving control signal generator 330 generates the deactivated pull-up and pull-down driving control signals SAP and SAN in response to the deactivated enable signal SA_EN.

FIG. 4 is a circuit diagram of the BLSA enable signal generator 310 in FIG. 3.

Referring to FIG. 4, the BLSA enable signal generator 310 includes a period signal generating unit 312, a delay unit 314 and an output unit 316.

The period signal generating unit 312 generates a period signal AP in response to the active pulse signal ACT_PUL and the precharge pulse signal PCG_PUL. Here, the active pulse signal ACT_PUL is a pulse signal that is activated to a logic low level for a predetermined time during the active operation, and the precharge pulse signal PCG_PUL is a pulse signal that is activated to a logic low level for a predetermined time during the precharge operation. Therefore, the period signal AP has a logic high level in response to the active pulse signal ACT_PUL and has a logic low level in response to the precharge pulse signal PCG_PUL.

The delay unit 314 delays the period signal AP by a predetermined delay time, and particularly, it delays a rising edge of the period signal AP from a logic low level to a logic high level. This will be more fully described below.

The output unit 316 generates the enable signal SA_EN according to the period signal AP and an output signal of the delay unit 314. The enable signal SA_EN is activated after the delay time, i.e., the sensing margin time, of the delay unit 314 from the activation timing of the active pulse signal ACT_PUL. The enable signal SA_EN is deactivated at the activation timing of the precharge pulse signal PCG_PUL.

An overall operation will be described briefly below.

First, when the precharge pulse signal PCG_PUL is activated to a logic low level, the period signal AP goes to a logic low level and the enable signal SA_EN goes to a logic low level.

When the active pulse signal ACT_PUL is activated to a logic low level, the output unit 316 outputs the enable signal SA_EN of logic low level continuously although the period signal AP is at a logic high level. Thereafter, the delay unit 314 delays the rising edge of the period signal AP by a predetermined delay time and outputs the delayed period signal, and thus the output unit 316 outputs the enable signal SA_EN of logic high level. Herein, the predetermined delay time of the delay unit 314 corresponds to the sensing margin time.

The enable signal SA_EN, which is activated after the sensing margin time in response to the active pulse signal ACT_PUL, is inputted to the driving control signal generator (330 of FIG. 3), and the driving control signal generator (330) activates the pull-up and pull-down driving control signals SAP and SAN. Afterwards, when the precharge pulse signal PCG_PUL is activated to a logic low level again, the enable signal SA_EN is deactivated to a logic low level, and the pull-up and pull-down driving control signals SAP and SAN are also deactivated.

Referring back to FIGS. 1 and 2, the sensing margin time, which is a time taken from the timing when the word line WL is enabled until the bit line sense amplifier 140 is driven, is one of very critical factors in designing a semiconductor memory device. If the sensing margin time is too short, a voltage difference between the bit line BL and the bit line bar /BL is not sufficient so that unwanted data may be amplified although the bit line sense amplifier 140 is operated. By contrast, if the sensing margin time is too long, the amplification timing of the data is delayed, leading to a decrease in an operating speed. That is, characteristics of a RAS to CAS delay (tRCD) set by specification become poor.

Referring to FIG. 4 again, the delay unit 314 includes first to fourth inverters 314A, 314B, 314C and 314D. Since the first to fourth inverters 314A, 314B, 314C and 314D have the same configuration, following description will be focused on only the first inverter 314A.

The first inverter 314A includes a PMOS transistor PM configured to be pull-up driven in response to the period signal AP of logic low level, an NMOS transistor configured to be pull-down driven in response to the period signal AP of logic high level, and a resistor R for an RC delay.

The resistor R is used to delay the rising edge of the period signal AP because the rising edge of the period signal AP is delayed by the sensing margin time and thus the enable signal SA_EN should be transited to a logic high level in response to the delayed period signal. As described above, when the period signal AP goes to a logic low level, the enable signal SA_EN goes to a logic low level regardless of the output signal of the delay unit 314.

Each resistor in the second to fourth inverters 314B, 314C and 314D as well as the resistor R of the first inverter 314A employs an N+ active resistor doped with N+ dopant in consideration of its area, voltage and temperature variations. However, the resistance of the N+ active resistor may be considerably changed depending on a process variation. This means that the sensing margin time ensured by the delay unit 314 may be changed.

In other words, the resistance of the N+ active resistor may be changed depending on the process variation, thereby changing the sensing margin time. Accordingly, the sensing margin time may be longer or shorter than a target sensing margin time. Consequently, if the sensing margin time becomes too short, unwanted data are amplified. On the contrary, if the sensing margin time becomes too long, characteristics of tRCD become poor.

SUMMARY OF THE INVENTION

Embodiments of the present invention are directed to providing a delay circuit capable of securing a constant delay time in spite of a process variation as well as voltage and temperature variations.

Embodiments of the present invention are also directed to providing a semiconductor memory device capable of amplifying desired data within a preset RAS to CAS delay (tRCD) using a delay circuit that secures a sensing margin time in spite of process, voltage and temperature variations.

In accordance with an aspect of the present invention, there is provided a delay circuit that includes a delay unit including a current source controlled by a bias voltage, a delay time of the delay unit being changed depending on current amount of the current source, and a bias voltage generating unit configured to divide a power supply voltage using a first resistor to generate the bias voltage, wherein the delay unit includes a second resistor inserted into a current path of the current source.

In accordance with an aspect of the present invention, there is provided a delay circuit that includes a delay unit including a current source controlled by a bias voltage and an inverter chain having a plurality of inverters, a propagation delay of the inverter chain being changed depending on current amount of the current source, and a bias voltage generating unit configured to divide a power supply voltage using a first resistor to generate the bias voltage, one or more of the plurality of inverters including a second resistor inserted into a current path of the current source.

In accordance with further aspect of the present invention, there is provided a semiconductor memory device that includes a period signal generating unit configured to generate a period signal in response to internal command signals, a delay unit including a current source controlled by a bias voltage and reflecting a delay time being changed depending on current amount of the current source to the period signal, a bias voltage generating unit configured to divide a power supply voltage using a first resistor to generate the bias voltage, and an output unit configured to output a bit line sense amplifier (BLSA) enable signal in response to the period signal and an output signal of the delay unit, wherein the delay unit includes a second resistor inserted into a current path of the current source.

In accordance with further aspect of the present invention, there is provided a method of driving a semiconductor memory device, the method including delaying a period signal generated in response to internal command signals by a predetermined time, detecting resistance variation characteristics according to a process variation to reflect the detected resistance variation characteristics in the predetermined time, and generating a bit line sense amplifier (BLSA) enable signal in response to the period signal and the delayed period signal.

In accordance with the aspect of the present invention, it is possible to prevent a delay time from being changed according to a process variation by detecting resistance variation characteristics, which is caused by the process variation, of an N+ active resistor of a delay circuit and then reflecting the detected resistance variation characteristics in the delay time of the delay circuit. Further, a constant sensing margin time can be always secured by the use of a constant delay time so that desired data can be amplified within a preset tRCD.

DESCRIPTION OF SPECIFIC EMBODIMENTS

Hereinafter, a delay circuit and a semiconductor memory device having the same in accordance with the present invention will be described in detail with reference to the accompanying drawings.

Figure 5:
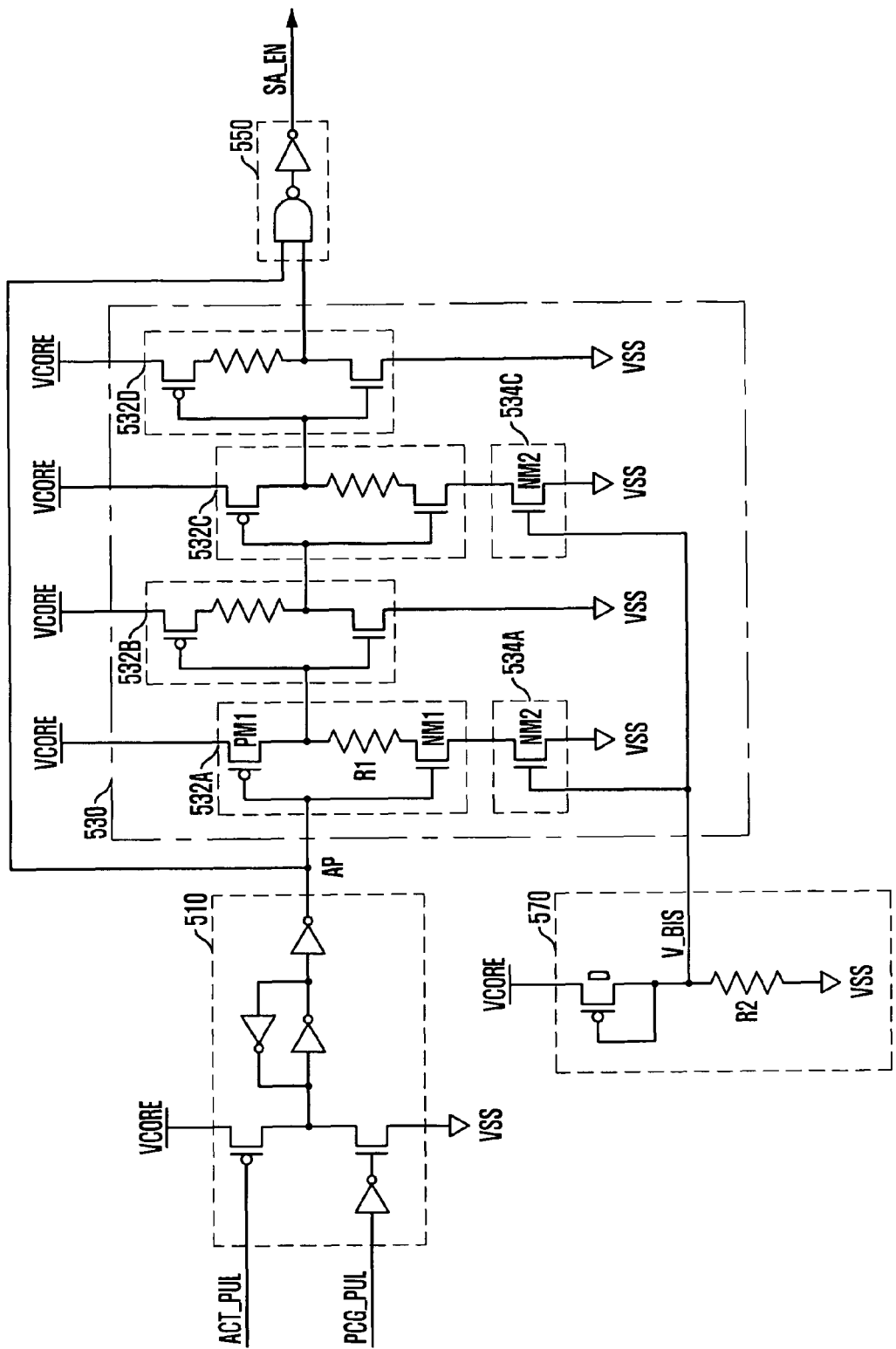
FIG. 5 is a circuit diagram of a BLSA enable signal generator in accordance with the present invention.

FIG. 5 is a circuit diagram of a bit line sense amplifier (BLSA) enable signal generator in accordance with the present invention.

Referring to FIG. 5, the BLSA enable signal generator includes a period signal generating unit 510, a delay unit 530, an output unit 550 and a bias voltage generating unit 570.

The period signal generating unit 510 generates a period signal AP in response to an active pulse signal ACT_PUL and a precharge pulse signal PCG_PUL. Here, the active pulse signal ACT_PUL is a pulse signal that is activated to a logic low level for a predetermined time during an active operation, and the precharge pulse signal PCG_PUL is a pulse signal that is activated to a logic low level for a predetermined time during a precharge operation. Therefore, the period signal AP has a logic high level in response to the active pulse signal ACT_PUL and has a logic low level in response to the precharge pulse signal PCG_PUL.

The delay unit 530 delays the period signal AP by a delay time which is changed depending on current amounts of current sources 534A and 534C controlled by a bias voltage V_BIS. The delay unit 530 may include an inverter chain having first to fourth inverters 532A, 532B, 532C and 532D configured to receive the period signal AP, and the first and second current sources 534A and 534C configured to receive the bias voltage V_BIS. In the present invention, it is possible to always reflect a constant delay time in the period signal AP using such a characteristic of the delay unit 530 that its delay time is changed according to the bias voltage V_BIS.

Figure 4:
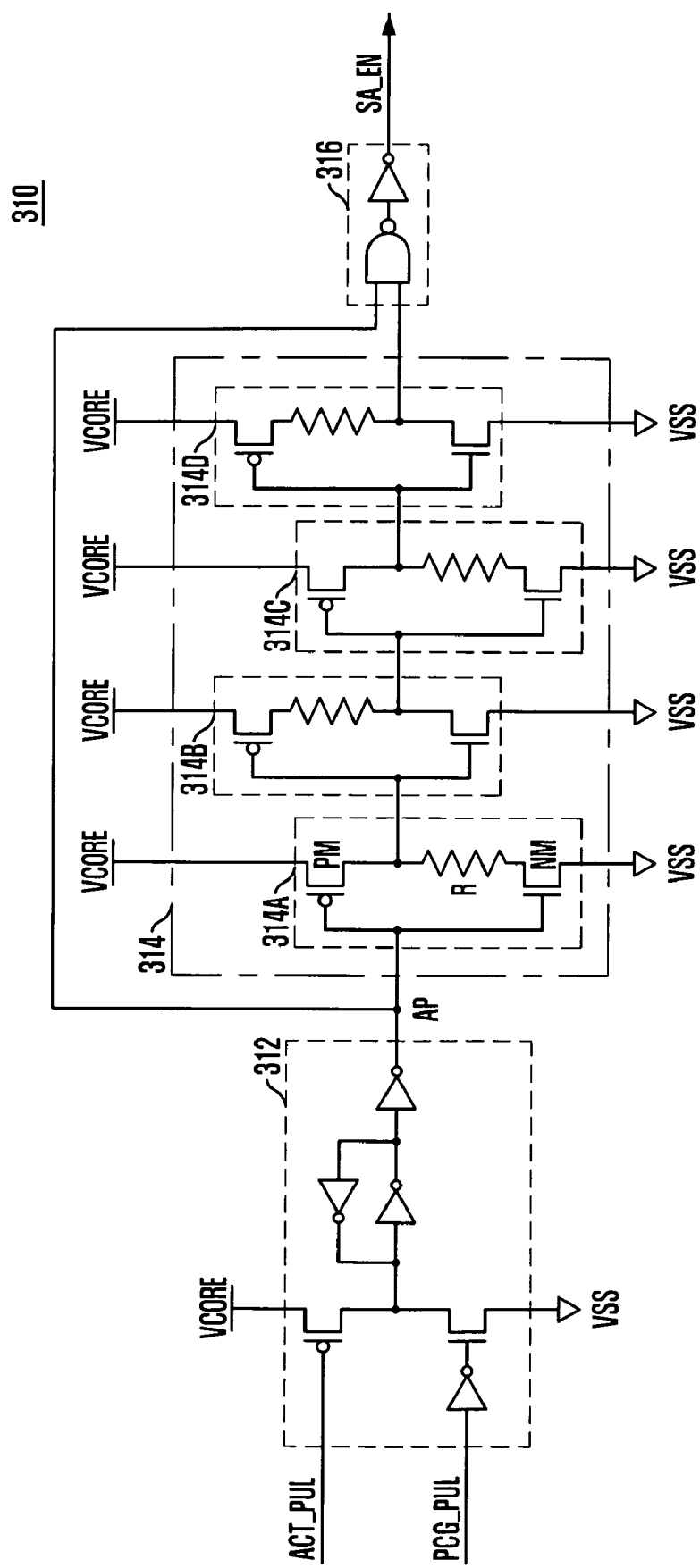
FIG. 4 is a circuit diagram of a bit line sense amplifier (BLSA) enable signal generator (310) in FIG. 3.

Since the second and fourth inverters 532B and 532D operate the same as those of the BLSA enable signal generator (310 of FIG. 4) of the conventional semiconductor memory device, and the first and third inverters 532A and 532C operate similarly, following description will be focused on only the first inverter 532A.

The first inverter 532A includes a first PMOS transistor PM1, a first resistor R1 and a first NMOS transistor NM1. The first PMOS transistor PM1 has a source-drain path between a core voltage (VCORE) terminal and an output terminal of the first inverter 532A, and receives the period signal AP through a gate thereof. The first resistor R1 is connected between the output terminal of the first inverter 532A and the first NMOS transistor NM1. The first NMOS transistor NM1 has a source-drain path between the first resistor R1 and the first current source 534A, and receives the period signal AP through a gate thereof. The first PMOS transistor PM1 is pull-up driven in response to a falling edge of the period signal AP from a logic high level to a logic low level, and the first NMOS transistor NM1 is pull-down driven in response to a rising edge of the period signal AP by.

The first resistor R1 is inserted into a current path of the first current source 534A and used for achieving an RC delay of the period signal AP. In particular, the first resistor R1 delays the rising edge of the period signal AP. This is because the rising edge of the period signal AP is delayed by the sensing margin time and thus the enable signal SA_EN should be transited to a logic high level in response to the delayed period signal like the conventional delay circuit. For reference, when the period signal AP goes to a logic low level, the enable signal SA_EN goes to a logic low level independent of the output signal of the delay unit 530.

The first current source 534A may include a second NMOS transistor NM2. The second NMOS transistor NM2 has a source-drain path between the first inverter 532A and a ground voltage (VSS) terminal, and receives the bias voltage V_BIS through a gate thereof. A propagation delay, i.e., a time taken for the period signal AP to be outputted through the first inverter 532A, is varied with a turn-on strength of the second NMOS transistor NM2. That is, if the turn-on strength of the second NMOS transistor NM2 is great, the first inverter 532A rapidly operates so that the propagation delay is shortened. On the contrary, if the turn-on strength of the second NMOS transistor NM2 is small, the first inverter 532A slowly operates so that the propagation delay is elongated.

The output unit 550 generates the enable signal SA_EN according to the period signal AP and an output signal of the delay unit 530. Therefore, the enable signal SA_EN is activated after the delay time, i.e., the sensing margin time, of the delay unit 530 corresponding to the bias voltage V_BIS from the activation timing of the active pulse signal ACT_PUL. The enable signal SA_EN is deactivated at the timing when the precharge pulse signal PCG_PUL is activated.

The bias voltage generating unit 570 divides a core voltage VCORE using the second resistor R2 to generate the bias voltage V_BIS. The bias voltage generating unit 570 may include a diode-connected PMOS transistor D connected between the VCORE terminal and a bias voltage (V_BIS) output terminal, and the second resistor R2 connected between the V_BIS output terminal and the VSS terminal. Here, the diode-connected PMOS transistor D has a constant resistance in spite of process variation, that is, serves as a fixed resistor, and the first and second resistors R1 and R2, which are N+ active resistors, have resistances varied according to the process variation.

In accordance with the present invention, the resistances of the first and second resistors R1 and R2 are varied according to the process variation. Such resistance variation characteristics are detected through a voltage division method and then reflected in the delay time of the delay unit 530. Consequently, it is possible to secure the constant delay time, i.e., the constant sensing margin time, in spite of the process variation.

An operation will be described in brief below.

First, when the precharge pulse signal PCG_PUL is activated to a logic low level, the period signal AP goes to a logic low level and the enable signal SA_EN goes to a logic low level.

When the active pulse signal ACT_PUL is activated to a logic low level, the output unit 550 outputs the enable signal SA_EN of logic low level continuously although the period signal AP is at a logic high level. Thereafter, the delay unit 530 delays the rising edge of the period signal AP by a predetermined delay time corresponding to the bias voltage V_BIS, and the output unit 550 outputs the enable signal SA_EN of logic high level.

The bias voltage V_BIS is changed according to the variable resistance of the second resistor R2 due to the process variation. That is, if the resistance of the second resistor R2 is increased due to the process variation, a level of the bias voltage V_BIS is increased. If, however, the resistance of the second resistor R2 is decreased due to the process variation, a level of the bias voltage V_BIS is decreased. The bias voltage V_BIS, of which a level is changed according to the process variation, controls the amount of current flowing out through the first current source 534A inserted into a pull-down current path. Here, the pull-down current path is formed by the output terminal of the first inverter 532A, the first resistor R1, the first NMOS transistor NM1, the first current source 534A, and the VSS terminal. Such a control mechanism is similarly performed in the second current source 534C connected to the third inverter 532C.

That is, although the resistances of the first and second resistors R1 and R2 are increased according to the process variation, the delay time of the delay unit 530 is not increased but maintained at a constant time because the bias voltage V_BIS is increased. On the contrary, although the resistances of the first and second resistors R1 and R2 are decreased according to the process variation, the delay time of the delay unit 530 is not decreased but maintained at the constant time because the bias voltage V_BIS is decreased.

Figure 1:
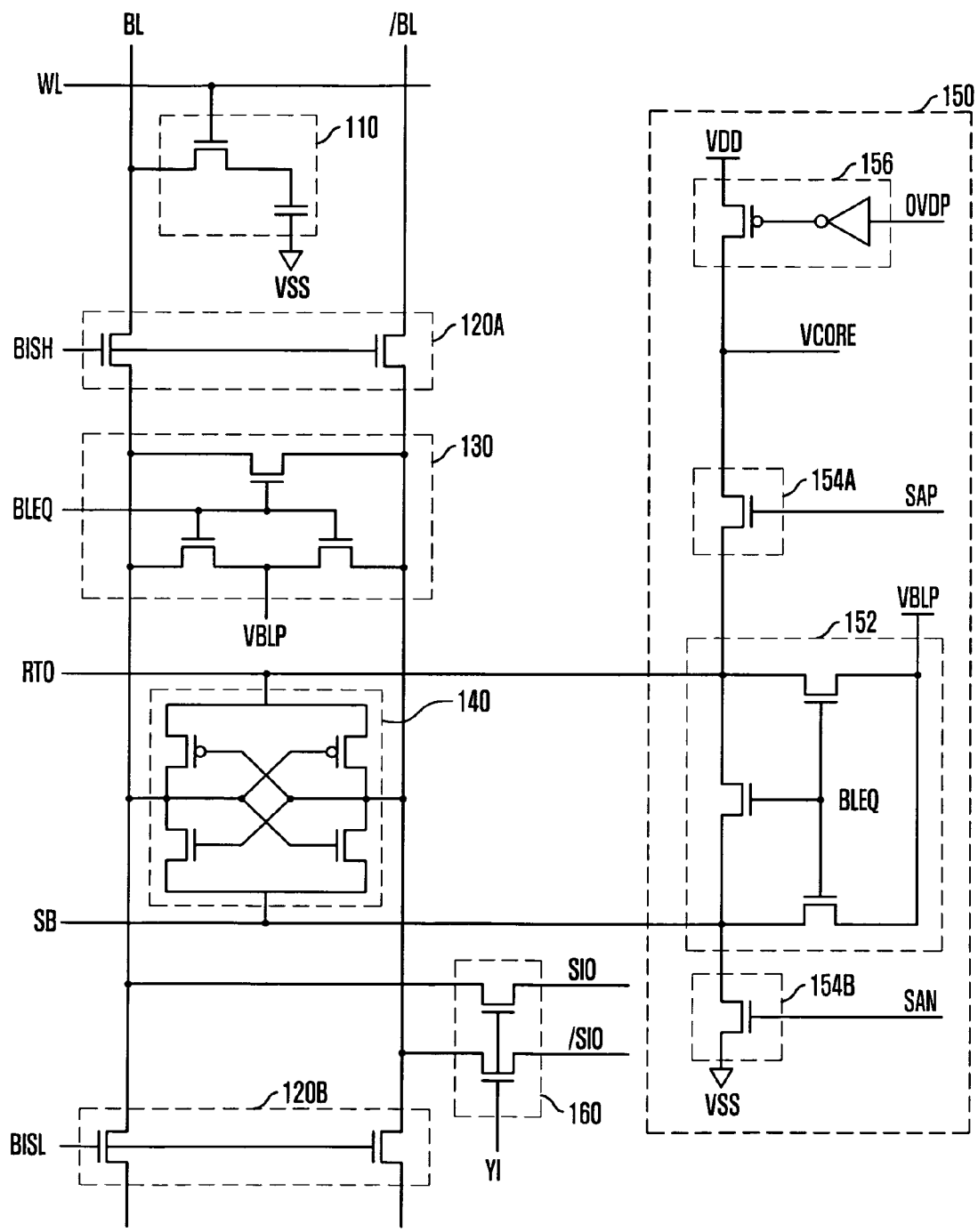
FIG. 1 is a circuit diagram illustrating a partial configuration of a conventional semiconductor memory device.
Figure 2:
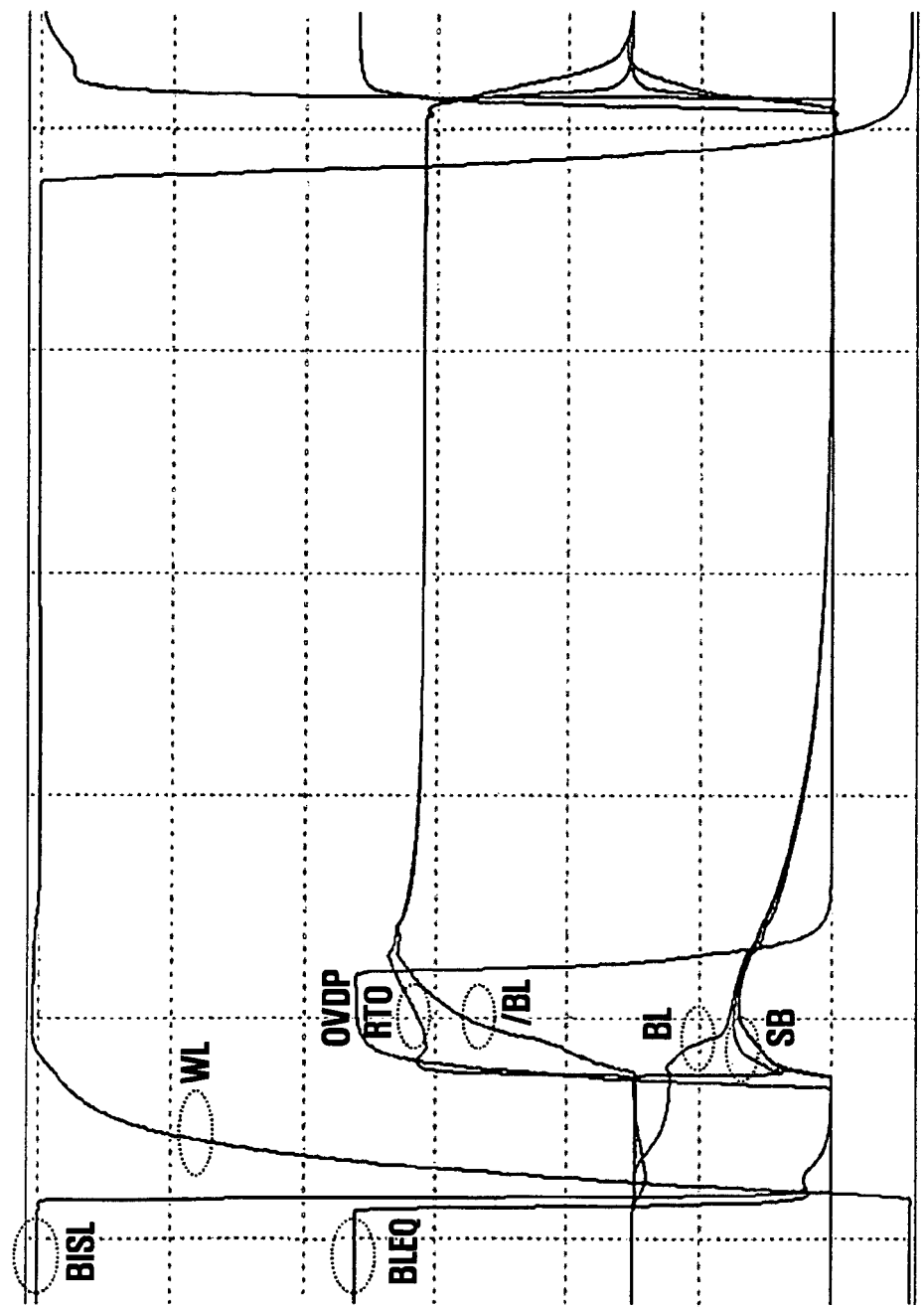
FIG. 2 is a simulation graph illustrating an active operation and a precharge operation of an upper memory cell (110) in FIG. 1.
Figure 3:
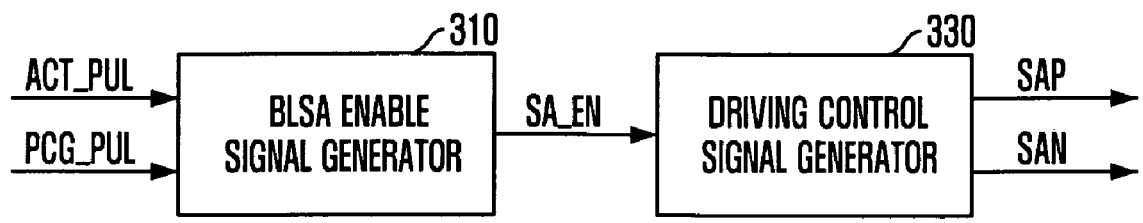
FIG. 3 is a block diagram illustrating a circuit block configured to generate a pull-up driving control signal (SAP) and a pull-down driving control signal (SAN).

Accordingly, the delay time, i.e., the sensing margin time, of the delay unit 530 controlled by the bias voltage V_BIS is maintained constantly in spite of the process variation. In this way, the enable signal SA_EN, which is activated after a predetermined sensing margin time in response to the active pulse signal ACT_PUL is inputted into a driving control signal generator (see 330 of FIG. 3), and the driving control signal generator (330) activates the pull-up and pull-down driving control signals SAP and SAN. Thereafter, when the precharge pulse signal PCG_PUL is activated to a logic low level, the enable signal SA_EN is deactivated to a logic low level and the pull-up and pull-down driving control signals SAP and SAN are also deactivated.

In the above-described embodiment, the first resistor R1 and the first current source 534A are inserted into the pull-down current path of the first inverter 532A to delay the rising edge of the period signal AP. However, the first resistor R1 and the first current source 534A may be inserted into a pull-up current path of the first inverter 532A to delay the falling edge of the period signal AP. Here, the pull-up current path is formed by the VCORE terminal, the first current source 534A, the first PMOS transistor PM1, the first resistor R1, and the output terminal of the first inverter 532A.

An operation of this case will be briefly described below. When the resistance of the resistor is increased due to the process variation, the timing of a falling edge of an input signal is delayed. To compensate for this, therefore, it should be necessary to increase the amount of current supplied through the pull-up current path. On the contrary, when the resistance of the resistor is decreased due to the process variation, the timing of the falling edge of the input signal is advanced. To compensate for this, therefore, it should be necessary to decrease the amount of current supplied through the pull-up current path. The configuration of such a circuitry is obvious to those skilled in the art, and thus further description will be omitted herein.

In accordance with the present invention, the constant delay time can be secured using the N+ active resistor even though a voltage and a temperature are varied. In addition, resistance variation characteristics are detected through a voltage division method even under the condition that the resistance may be varied according to the process variation, and the detected resistance variation characteristics are reflected in the delay circuit, thus securing a constant delay time.

Further, because a constant sensing margin time can be always secured using the delay circuit, desired data can be amplified within a preset tRCD.

As described above, in accordance with the present invention, it is possible to secure a constant delay time in spite of voltage, temperature and process variations by detecting resistance variation characteristics of a resistor caused by the process variation and then reflecting the detected resistance variation characteristics in the delay time.

Furthermore, because a preset tRCD can be secured using the constant sensing margin time, a circuitry can operate more precisely and rapidly.

In addition, a target sensing margin time can be stably secured, thus making it possible to achieve reliable data.

While the present invention has been described with respect to the specific embodiments, it will be apparent to those skilled in the art that various changes and modifications may be made without departing from the spirit and scope of the invention as defined in the following claims.

For example, logic gates and transistors exemplarily illustrated in the aforesaid embodiments may change their locations and kinds depending on polarities of signals.

Although the foregoing embodiments illustrated that a resistor was provided in each of the first to fourth inverters 532A, 532B, 532C and 532D, the resistor may be provided in only one or more inverters.

What is claimed is:

1. A delay circuit, comprising:
   a delay unit including a current source controlled by a bias voltage, a delay time of the delay unit being changed depending on current amount of the current source; and
   a bias voltage generating unit configured to divide a power supply voltage using a first resistor to generate the bias voltage,
   wherein the delay unit includes a second resistor inserted into a current path of the current source.

2. The delay circuit as recited in claim 1, wherein the first and second resistors have the same variation characteristics with respect to a process variation.

3. The delay circuit as recited in claim 1, wherein, in the delay unit, the second resistor and the current source are inserted into a pull-down current path responsive to a first edge of an input signal, or inserted into a pull-up current path responsive to a second edge of the input signal.

4. The delay circuit as recited in claim 3, wherein the current source inserted into the pull-down current path controls amount of current flowing out through the pull-down current path in response to the bias voltage.

5. The delay circuit as recited in claim 3, wherein the current source inserted into the pull-up current path controls amount of current flowing out through the pull-up current path in response to the bias voltage.

6. The delay circuit as recited in claim 1, wherein the bias voltage generating unit includes:
   the first resistor; and
   a fixed resistor having a constant resistance with respect to a process variation,
   the first resistor and the fixed resistor being connected in series between terminals of the power supply voltage and a voltage having a different level from the power supply voltage.

7. The delay circuit as recited in claim 1, wherein the bias voltage generating unit includes:
   a fixed resistor connected between a power supply voltage terminal and an output terminal of the bias voltage; and
   the first resistor connected between the output terminal and a ground voltage terminal.

8. The delay circuit as recited in claim 1, wherein the first and second resistors includes an N+ active resistor.

9. A delay circuit, comprising:
   a delay unit including a current source controlled by a bias voltage and an inverter chain having a plurality of inverters, a propagation delay of the inverter chain being changed depending on current amount of the current source; and
   a bias voltage generating unit configured to divide a power supply voltage using a first resistor to generate the bias voltage,
   at least one of the plurality of inverters including a second resistor inserted into a current path of the current source.

10. The delay circuit as recited in claim 9, wherein the first and second resistors have the same variation characteristics with respect to a process variation.

11. The delay circuit as recited in claim 9, wherein, in the one or more of the plurality of inverters, the second resistor and the current source are inserted into a pull-down current path responsive to a first edge of an input signal, or inserted into a pull-up current path responsive to a second edge of the input signal.

12. The delay circuit as recited in claim 11, wherein the current source inserted into the pull-down current path controls amount of current flowing out through the pull-down current path in response to the bias voltage.

13. The delay circuit as recited in claim 11, wherein the current source inserted into the pull-up current path controls amount of current flowing out through the pull-up current path in response to the bias voltage.

14. The delay circuit as recited in claim 9, wherein the bias voltage generating unit includes:
   the first resistor; and
   a fixed resistor having a constant resistance with respect to a process variation,
   the first resistor and the fixed resistor being connected in series between terminals of the power supply voltage and a voltage having a different level from the power supply voltage.

15. The delay circuit as recited in claim 9, wherein the bias voltage generating unit includes:
   a fixed resistor connected between a power supply voltage terminal and an output terminal of the bias voltage; and
   the first resistor connected between the output terminal and a ground voltage terminal.

16. The delay circuit as recited in claim 9, wherein the first and second resistors includes an N+ active resistor.

17. A semiconductor memory device, comprising:
   a period signal generating unit configured to generate a period signal in response to internal command signals;
   a delay unit including a current source controlled by a bias voltage and reflecting a delay time being changed depending on current amount of the current source to the period signal;
   a bias voltage generating unit configured to divide a power supply voltage using a first resistor to generate the bias voltage; and
   an output unit configured to output a bit line sense amplifier (BLSA) enable signal in response to the period signal and an output signal of the delay unit,
   wherein the delay unit includes a second resistor inserted into a current path of the current source.

18. The semiconductor memory device as recited in claim 17, wherein the internal command signals include an active signal and a precharge signal,
   the period signal being activated in response to the active signal and deactivated in response to the precharge signal.

19. The semiconductor memory device as recited in claim 18, wherein the BLSA enable signal is activated after the delay time from an activation timing of the period signal, and deactivated in response to the precharge signal.

20. The semiconductor memory device as recited in claim 17, wherein the first and second resistors have the same variation characteristics with respect to a process variation.

21. The semiconductor memory device as recited in claim 17, wherein the delay unit includes an inverter chain having a plurality of inverters.

22. The semiconductor memory device as recited in claim 21, wherein, in at least one of the plurality of inverters, the second resistor and the current source are inserted into a pull-down current path responsive to a first edge of the period signal, or inserted into a pull-up current path responsive to a second edge of the period signal.

23. The semiconductor memory device as recited in claim 22, wherein the current source inserted into the pull-down current path controls amount of current flowing out through the pull-down current path in response to the bias voltage.

24. The semiconductor memory device as recited in claim 22, wherein the current source inserted into the pull-up current path controls amount of current flowing out through the pull-up current path in response to the bias voltage.

25. The semiconductor memory device as recited in claim 17, wherein the bias voltage generating unit includes:
   the first resistor; and
   a fixed resistor having a constant resistance with respect to a process variation,
   the first resistor and the fixed resistor being connected in series between terminals of the power supply voltage and a voltage having a different level from the power supply voltage.

26. The semiconductor memory device as recited in claim 17, wherein the bias voltage generating unit includes:
   a fixed resistor connected between a power supply voltage terminal and an output terminal of the bias voltage; and
   the first resistor connected between the output terminal and a ground voltage terminal.

27. The semiconductor memory device as recited in claim 17, wherein the first and second resistors includes an N+ active resistor.

28. A method of driving a semiconductor memory device, the method comprising:
   delaying a period signal generated in response to internal command signals by a predetermined time;
   detecting resistance variation characteristics according to a process variation to reflect the detected resistance variation characteristics in the predetermined time; and
   generating a bit line sense amplifier (BLSA) enable signal in response to the period signal and the delayed period signal.

29. The method as recited in claim 28, wherein detecting the resistance variation characteristics includes:
   dividing a power supply voltage to generate a bias voltage; and
   adjusting an operating current controlling the predetermined time in response to the bias voltage.

30. The method as recited in claim 28, wherein the internal command signals include an active signal and a precharge signal,
   the period signal being activated in response to the active signal and deactivated in response to the precharge signal.

31. The method as recited in claim 30, wherein the BLSA enable signal is activated after the predetermined time from an activation timing of the period signal, and deactivated in response to the precharge signal.

* * * * *